US012701767B2

(12) United States Patent
Yen et al.

(10) Patent No.: US 12,701,767 B2
(45) Date of Patent: Aug. 4, 2026

(54) SEMICONDUCTOR DEVICE

(71) Applicant: Industrial Technology Research Institute, Hsinchu (TW)

(72) Inventors: Chih-Hung Yen, Taipei City (TW);
Hua-Mao Chen, Tainan City (TW);
Yu-Ting Chen, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 402 days.

(21) Appl. No.: 18/402,748

(22) Filed: Jan. 3, 2024

(65) Prior Publication Data

US 2025/0031427 A1     Jan. 23, 2025

Related U.S. Application Data

(60) Provisional application No. 63/527,599, filed on Jul. 19, 2023.

(30) Foreign Application Priority Data

Oct. 13, 2023    (TW) ................................. 112139244

(51) Int. Cl.
H10D 64/00        (2025.01)
H10D 64/01        (2025.01)
(Continued)

(52) U.S. Cl.
CPC ........... H10D 64/112 (2025.01); H10D 64/01 (2025.01); H10D 64/117 (2025.01); H10D 64/513 (2025.01); H10W 20/43 (2026.01)

(58) Field of Classification Search
CPC .... H10D 64/112; H10D 64/01; H10D 64/117; H10D 64/513; H10D 30/0297; H10D 30/668; H10D 62/127; H10W 20/43
(Continued)

(56) References Cited

U.S. PATENT DOCUMENTS 8,889,511 B2    11/2014  Yedinak et al.
9,252,266 B2     2/2016  Iwamuro
(Continued)

FOREIGN PATENT DOCUMENTS

| CN | 106876485 | 11/2020 |
| TW | 201030972 | 8/2010 |
| TW | I524525 | 3/2016 |

OTHER PUBLICATIONS

"Office Action of Taiwan Counterpart Application", issued on Aug. 8, 2024, pp. 1-5.

*Primary Examiner* — Theresa T Doan
(74) *Attorney, Agent, or Firm* — JCIPRNET

(57) ABSTRACT

A semiconductor device includes a substrate, a dummy gate structure, and a gate structure. The substrate has a dummy gate trench and a gate trench, and includes a first well region, a second well region and a source region. The first well region is formed by doping at least one element from a first element group, and has a first conductive channel. The second well region is formed by doping at least one element from a second element group, the second well region is on the first well region and has a second conductive channel, a polarity of the second conductive channel is opposite to that of the first conductive channel. The dummy gate structure is in the dummy gate trench of the substrate, and a portion of the dummy gate structure is in the first well region. The gate structure is between the adjacent dummy gate structures.

10 Claims, 9 Drawing Sheets

(51) Int. Cl.
  *H10D 64/27* (2025.01)
  *H10W 20/43* (2026.01)

(58) Field of Classification Search
  USPC .......................................................... 257/409
  See application file for complete search history.

(56) References Cited

U.S. PATENT DOCUMENTS

| | | | |
|---|---|---|---|
| 10,529,845 B2 | 1/2020 | Mirchandani et al. | |
| 10,923,578 B2 | 2/2021 | Leendertz et al. | |
| 2006/0244056 A1 * | 11/2006 | Miura .................. | H10D 30/668 |
| | | | 257/330 |
| 2006/0273386 A1 | 12/2006 | Mlmaz et al. | |
| 2010/0013010 A1 * | 1/2010 | Akiyama ............. | H10D 30/668 |
| | | | 257/334 |

\* cited by examiner

SEMICONDUCTOR DEVICE

CROSS-REFERENCE TO RELATED APPLICATION

This application claims the priority benefit of U.S. provisional application Ser. No. 63/527,599, filed on Jul. 19, 2023 and Taiwan application Ser. No. 112139244, filed on Oct. 13, 2023. The entirety of each of the above-mentioned patent applications are hereby incorporated by reference herein and made a portion of this specification.

TECHNICAL FIELD

The disclosure relates to a power semiconductor device.

BACKGROUND

In power semiconductor devices, the phenomenon of electric field concentration is likely to occur at the boundary of the base region (or channel layer) and/or at the bottom of the trench-type gate. Therefore, how to suppress this phenomenon to increase the breakdown voltage of power semiconductor devices is one of the current goals.

SUMMARY

A semiconductor device that may suppress the above electric field concentration phenomenon to increase the breakdown voltage of the semiconductor device is provided in the disclosure.

In some embodiments, a semiconductor device includes a substrate, a dummy gate structure, a gate structure, a first interconnection structure, and a second interconnection structure. The substrate has a dummy gate trench and a gate trench, and includes a first well region, a second well region, and a source region. The first well region is formed by doping at least one element from a first element group, and has a first conductive channel. The second well region is formed by doping at least one element from a second element group, a number of valence electrons in the second element group and a number of valence electrons in the first element group are different, the second well region is located on the first well region and has a second conductive channel, and a polarity of the second conductive channel is opposite to that of the first conductive channel. The source region is formed by doping at least one element and a dopant from the first element group, in which an atomic concentration of the source region is higher than that of the first well region, and the source region is located in the second well region and has the first conductive channel. The dummy gate structure is located in the dummy gate trench of the substrate, and a portion of the dummy gate structure is located in the first well region. The gate structure is located in the gate trench of the substrate, and is located between adjacent dummy gate structures. The first interconnection structure is located on the substrate and includes a dummy gate terminal. The second interconnection structure is located on the first interconnection structure, in which the dummy gate structure and the second interconnection structure are electrically connected through the dummy gate terminal.

In other embodiments, the semiconductor device includes a substrate, a dummy gate structure, and a gate structure. The substrate has a dummy gate trench and a gate trench, and includes a first well region, a second well region, and a source region. The first well region is formed by doping at least one element from a first element group, and has a first conductive channel. The second well region is formed by doping at least one element from a second element group, a number of valence electrons in the second element group and a number of valence electrons in the first element group are different, the second well region is located on the first well region and has a second conductive channel, and a polarity of the second conductive channel is opposite to that of the first conductive channel. The source region is formed by doping at least one element and a dopant from the first element group, in which an atomic concentration of the source region is higher than that of the first well region, and the source region is located in the second well region and has the first conductive channel. The dummy gate structure is located in the dummy gate trench of the substrate, and a portion of the dummy gate structure is located in the first well region. The gate structure is located in the gate trench of the substrate, and is located between adjacent dummy gate structures. An interface dipole is formed between the dummy gate structure and the first well region.

DETAILED DESCRIPTION OF DISCLOSED EMBODIMENTS

In the following embodiments, the first conductive channel is P-type, and the second conductive channel is N-type; however, the disclosure is not limited thereto. In other embodiments, the first conductive channel may be P-type and the second conductive channel may be N-type.

Figure 1:
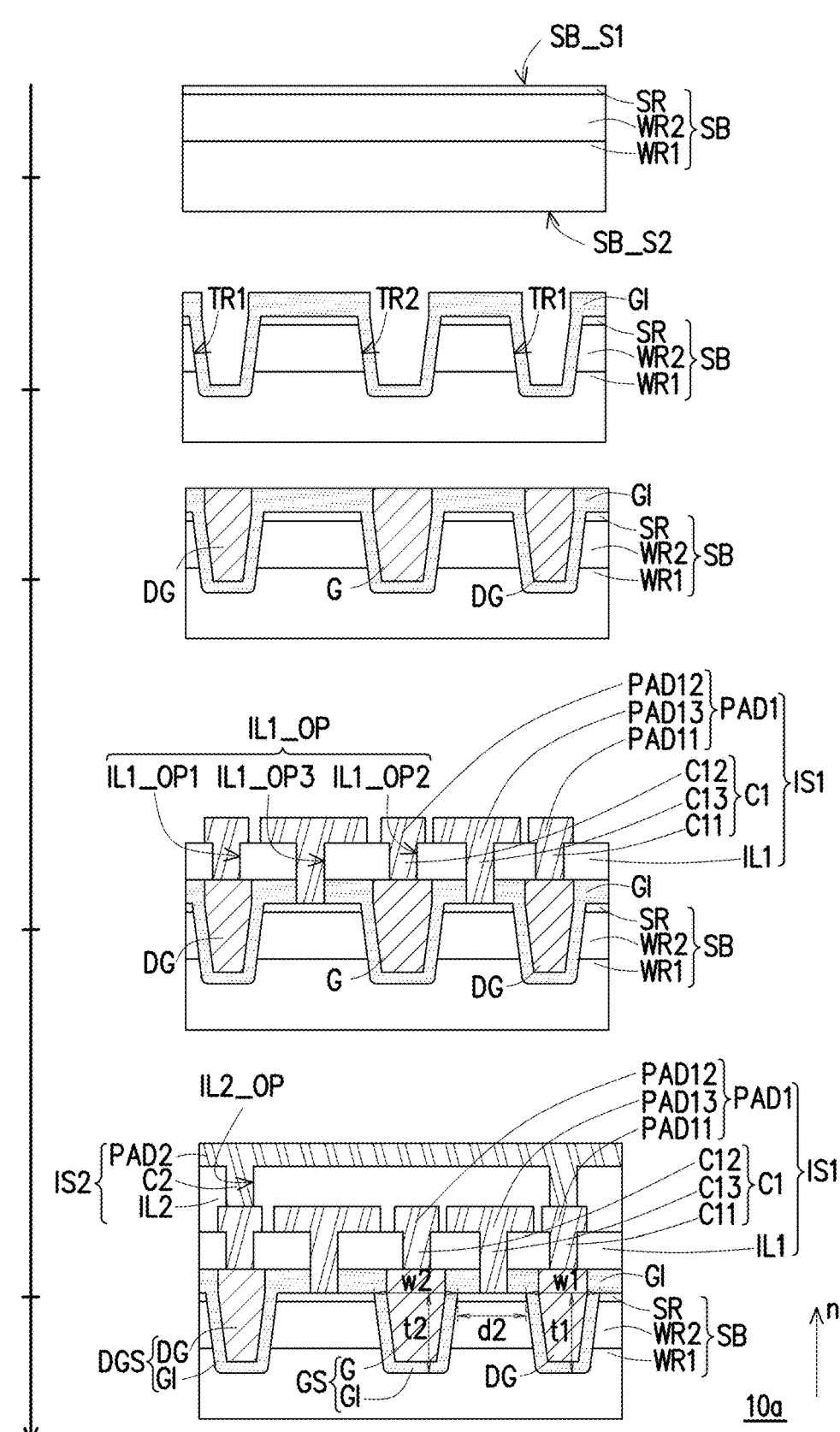
FIG. 1 is a process schematic diagram of a manufacturing method of a semiconductor device according to an embodiment of the disclosure.

FIG. 1 is a process schematic diagram of a manufacturing method of a semiconductor device according to an embodiment of the disclosure.

Referring to FIG. 1, a substrate SB is provided. The material of the substrate SB may include, for example, a semiconductor or a semiconductor compound. For example, the material of the substrate SB may include silicon carbide (SiC), silicon (Si), gallium nitride (GaN) or sapphire, but the disclosure is not limited thereto. In this embodiment, the substrate SB has a first surface SB_S1 and a second surface SB_S2 opposite to the first surface SB_S1.

In this embodiment, the substrate SB has a first well region WR1 and a second well region WR2, in which the second well region WR2 is located on the first well region WR1. In some embodiments, the first well region WR1 and the second well region WR2 may be formed in the substrate SB by performing an epitaxial growth process, but the disclosure is not limited thereto. In other embodiments, the first well region WR1 and the second well region WR2 may be formed in the substrate SB by performing an ion implantation process.

The first well region WR1 includes, for example, at least one element in the first element group, and has, for example, a first conductive channel. In detail, the first well region WR1 may be formed by doping at least one element from the first element group. The second well region WR2 includes, for example, at least one element in the second element group, and has, for example, a second conductive channel, in which the polarity of the second conductive channel is opposite to that of the first conductive channel. In detail, the second well region WR2 may be formed by doping at least one element from the second element group. In addition, for example, the number of valence electrons in the first element group and the number of valence electrons in the second element group are different. In this embodiment, the first element group may include phosphorus, arsenic, or other pentavalent elements. That is, the conductive channel in the first well region WR1 is N-type. The second element group may include boron, aluminum, or other trivalent elements. That is, the conductive channel in the second well region WR2 is P-type, but the disclosure is not limited thereto. For example, the first well region WR1 may be formed by doping at least one element among pentavalent elements to a tetravalent element, and the second well region WR2 may be formed by doping at least one element among trivalent elements to a tetravalent element. The tetravalent element may be, for example, silicon, germanium or other suitable elemental semiconductors, and the disclosure is not limited thereto. In some embodiments, the dopants included in each of the first well region WR1 and the second well region WR2 may be formed in situ during an epitaxial growth process, but the disclosure is not limited thereto. In other embodiments, the first well region WR1 and the second well region WR2 may be formed by implanting dopants included in each of the first well region WR1 and the second well region WR2 into the substrate SB through an ion implantation process.

In this embodiment, the substrate SB further includes a source region SR, in which the source region SR is located in the second well region WR2. The source region SR includes, for example, at least one element in the first element group, and has, for example, a first conductive channel. In this embodiment, the element of the first element group included in the source region SR may be phosphorus, arsenic, or other pentavalent elements. That is, the conductive channel in the source region SR is N-type, but the disclosure is not limited thereto. The source region SR may be formed by doping at least one element and a dopant from the first element group. For example, the source region SR may be formed by doping at least one element among the pentavalent elements to a tetravalent element. The tetravalent element may be, for example, silicon, germanium or other suitable elemental semiconductors, and the disclosure is not limited thereto. In some embodiments, the atomic concentration of the source region SR is greater than the atomic concentration of the first well region WR1. That is, the source region SR may include additional dopants relative to the first well region WR1, such that the atomic concentration of the source region SR is greater than that of the first well region WR1. The source region SR may be formed, for example, by performing an ion implantation process to implant an N-type dopant into the first surface SB_S1 of the substrate SB, but the disclosure is not limited thereto. In some embodiments, the doping concentration of the source region SR is higher than $10^{19}$ $cm^{-3}$, but the disclosure is not limited thereto.

Continue referring to FIG. 1, a patterning process is performed on the substrate SB to form multiple trenches TR in the substrate SB. Afterwards, a gate dielectric layer GI is formed on the first surface SB_S1 of the substrate SB.

In some embodiments, the patterning process performed on the substrate SB may include performing the following steps, but the disclosure is not limited thereto.

First, a mask (not shown) is formed on the first surface SB_S1 of the substrate SB. Next, an etching process is performed on the substrate SB using the mask to form multiple trenches TR in the substrate SB. Afterwards, the mask is removed. In some embodiments, the bottom of the trench TR extends to the first well region WR1. From another perspective, the formation of the trench TR divides the second well region WR2 (including the source region SR). In this embodiment, the trench TR includes a dummy gate trench TR1 and a gate trench TR2 adjacent to the dummy gate trench TR1.

In some embodiments, the gate dielectric layer GI may be formed using chemical vapor deposition or other suitable processes, but the disclosure is not limited thereto. In some embodiments, the material of the gate dielectric layer GI includes silicon oxide ($SiO_2$), silicon oxynitride (SiON), silicon nitride (SiN) or other suitable dielectric materials, but the disclosure is not limited thereto. In other embodiments, the material of the gate dielectric layer GI may include a material with a high dielectric constant. In this embodiment, a portion of the gate dielectric layer GI is located in multiple trenches TR and may be in contact with the first well region WR1 and the second well region WR2.

Continue referring to FIG. 1, a gate G and a dummy gate DG are formed in each of the trenches TR of the substrate SB. In some embodiments, forming the gate G and the dummy gate DG may include performing the following steps, but the disclosure is not limited thereto.

First, a gate material layer (not shown) is formed on the first surface SB_S1 of the substrate SB using chemical vapor deposition or other suitable processes, in which the gate material layer at least fills the trenches TR of the substrate SB. Then, an etching back process or other suitable processes are performed on the gate material layer to remove the gate material layer outside the trench TR. The dummy gate DG is formed in the dummy gate trench TR1, and the gate G is formed in the gate trench TR2. The dummy gate DG and the gate G may, for example, include suitable conductive materials. For example, the materials of the dummy gate DG and the gate G may include polycrystalline silicon (poly Si), titanium (Ti), aluminum (Al), tungsten (W), gold (Au), or combinations thereof, but the disclosure is not limited thereto.

Continue referring to FIG. 1, a first interconnection structure IS1 is formed on the first surface SB_S1 of the substrate SB, in which the first interconnection structure IS1 includes a dielectric layer IL1, a contact element C1, and a pad PAD1.

In some embodiments, forming the first interconnection structure IS1 may include performing the following steps, but the disclosure is not limited thereto.

First, a dielectric material layer (not shown) is formed on the first surface SB_S1 of the substrate SB using chemical vapor deposition or other suitable processes, in which the dielectric material layer covers the gate electrode G, the dummy gate electrode DG, and the gate dielectric layer GI. Next, a patterning process is performed on the dielectric material layer to form a dielectric layer IL1 including an opening IL1_OP. The opening IL1_OP of the dielectric layer IL1 includes the opening IL1_OP1 exposing the dummy gate DG, the opening IL1_OP2 exposing the gate G, and the opening IL1_OP3 exposing the source region SR. Afterwards, the contact element C1 is formed in the opening IL1_OP of the dielectric layer IL1 by using a suitable process, and the pad PAD1 electrically connected to the contact element C1 is formed on the dielectric layer IL1 by using a suitable process. In this embodiment, the contact element C1 includes a contact element C11 electrically connected to the dummy gate DG, a contact element C12 electrically connected to the gate G, and a contact element C13 electrically connected to the source region SR. In addition, in this embodiment, the pad PAD1 includes a pad PAD11 electrically connected to the contact element C11, a pad PAD12 electrically connected to the contact element C12, and a pad PAD13 electrically connected to the contact element C13.

Continue referring to FIG. 1, a second interconnection structure IS2 is formed on the first surface SB_S1 of the substrate SB, in which the second interconnection structure IS2 includes a dielectric layer IL2, a contact element C2, and a pad PAD2. In some embodiments, forming the second interconnection structure IS2 may include performing the following steps, but the disclosure is not limited thereto.

First, a dielectric material layer (not shown) is formed on the first surface SB_S1 of the substrate SB using chemical vapor deposition or other suitable processes, in which the dielectric material layer covers the pad PAD1 and the dielectric layer IL1. Next, a patterning process is performed on the dielectric material layer to form a dielectric layer IL2 including an opening IL2_OP. The opening IL2_OP of the dielectric layer IL2 includes an opening IL2_OP that exposes the pad PAD11. Afterwards, the contact element C2 electrically connected to the pad PAD11 is formed in the opening IL2_OP of the dielectric layer IL2 by using a suitable process, and a pad PAD2 electrically connected to the contact element C2 is formed on the dielectric layer IL2 by using a suitable process.

At this point, the manufacturing method of the semiconductor device 10a of this embodiment is completed, but the manufacturing method of the semiconductor device of the disclosure is not limited thereto.

The semiconductor device 10a of this embodiment is introduced below using FIG. 2A and FIG. 2B, and the overlapping technical content are not repeated herein.

Figures 2A, 2B:
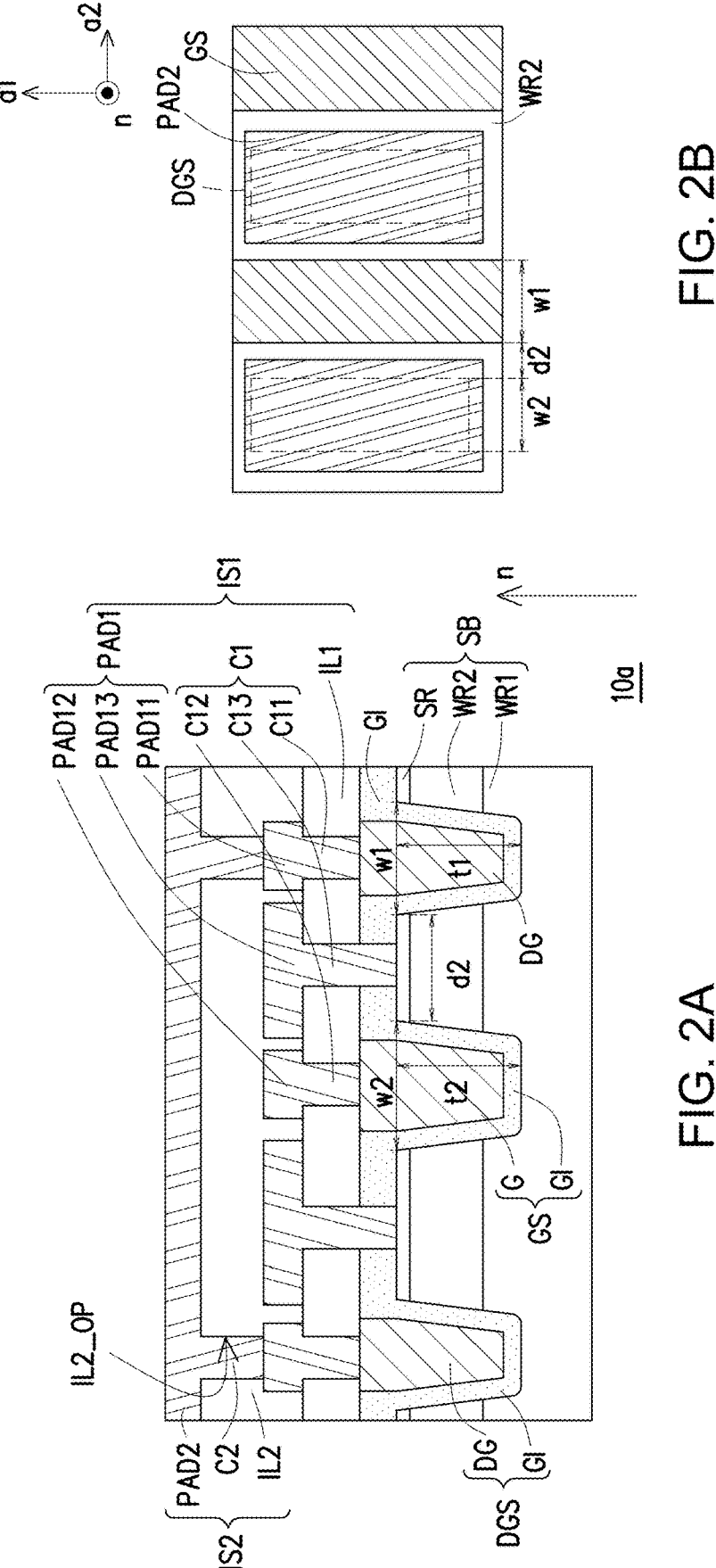
FIG. 2A is a partial cross-sectional schematic diagram of a semiconductor device of an embodiment manufactured according to the process of FIG. 1.
FIG. 2B is a partial top view schematic diagram of the semiconductor device according to the first embodiment of FIG. 2A.

FIG. 2A is a partial cross-sectional schematic diagram of a semiconductor device of an embodiment manufactured according to the process of FIG. 1, and FIG. 2B is a partial top view schematic diagram of the semiconductor device according to the first embodiment of FIG. 2A.

In this embodiment, the semiconductor device 10a includes a substrate SB, a dummy gate structure DGS, a gate structure GS, a first interconnection structure IS1, and a second interconnection structure IS2.

The substrate SB has, for example, a first surface SB_S1 and a second surface SB_S2, and includes, for example, a first well region WR1, a second well region WR2, and a source region SR. The first well region WR1 has, for example, a first conductive channel, and serves as a drift region in the semiconductor device 10a. In some embodiments, a drain region (not shown) having a first conductive channel may be disposed below the first well region WR1, in which the doping dose of the drain region is greater than the doping dose of the first well region WR1, but the disclosure is not limited thereto. The second well region WR2 is, for example, located on the first well region WR1 and has a second conductive channel, and serves as a base region in the semiconductor device 10a. The source region SR is, for example, located in the second well region WR2 and has a first conductive channel. In some embodiments, the source region SR is located between the gate structure GS and the dummy gate structure DGS.

The dummy gate structure DGS is located, for example, in the substrate SB. In this embodiment, the dummy gate structure DGS may include a dummy gate DG and a gate dielectric layer GI located in the dummy gate trench TR1 of the substrate SB. The dummy gate structure DGS may extend from the source region SR to the first well region WR1, that is, a portion of the dummy gate structure DGS may be located in the first well region WR1. In some embodiments, the dummy gate trench TR1 has a depth t1 greater than or equal to 1 micron and less than or equal to 4 microns. For example, the dummy gate trench TR1 may have a depth t1 of 1.5 microns. In addition, in some embodiments, the distance d1 between two adjacent dummy gate trenches TR1 is less than or equal to 4 microns. For example, the distance d1 between two adjacent dummy gate trenches TR1 may be 4 microns.

The gate structure GS is, for example, located in the substrate SB, and is, for example, located between adjacent dummy gate structures DGS. In this embodiment, the gate structure GS may include a gate G and a gate dielectric layer GI located in the gate trench TR2 of the substrate SB. In some embodiments, the gate trench TR2 has a depth t2 greater than or equal to 0.25 microns and less than or equal to 5 microns. For example, the gate trench TR2 may have a depth t2 of 2 microns. In addition, in some embodiments, the distance d2 between the adjacent gate trench TR2 and the dummy gate trench TR1 is less than 8 microns. For example, the distance d2 between the adjacent gate trench TR2 and the dummy gate trench TR1 may be 2 microns.

In this embodiment, the dimensions of the dummy gate trench TR1 is less than the dimensions of the gate trench TR2, and the dimensions of the dummy gate trench TR1 have the following relationship with the dimensions of the gate trench TR2, for example, to achieve a balance between the integration of the semiconductor device 10a and the reduction of electric field concentration phenomenon. In some embodiments, the depth t1 of the dummy gate trench TR1 and the depth t2 of the gate trench TR2 have the following relationship: $15\% \leq t1/t2 \leq 95\%$. In other embodiments, the depth t1 of the dummy gate trench TR1 and the depth t2 of the gate trench TR2 have the following relationship: $(t2-t1)<1$ micron. In addition, in some embodiments, the width w1 of the dummy gate trench TR1 and the width w2 of the gate trench TR2 have the following relationship: $15\% \leq w1/w2 \leq 95\%$.

Although the gate structure GS of this embodiment is a trench-type gate structure, the disclosure is not limited thereto. In other embodiments, the gate structure GS may be a planar gate structure. Furthermore, in other embodiments, the gate structure GS may be a split gate structure.

The first interconnection structure IS1 is, for example, located on the first surface SB_S1 of the substrate SB. In this embodiment, the first interconnection structure IS1 includes a dielectric layer IL1, a contact element C1, and a pad PAD1. The contact element C1 includes a contact element C11, a contact element C12, and a contact element C13. The pad PAD1 includes a pad PAD11, a pad PAD12, and a pad PAD13. The dummy gate DG in the dummy gate structure DGS is electrically connected to the contact element C11 and the pad PAD11. The gate G in the gate structure GS is electrically connected to the contact element C12 and the pad PAD12. The source region SR is electrically connected to the contact element C13 and the pad PAD13. In this embodiment, the contact element C11 may serve as a first dummy gate contact window in the semiconductor device 10a. The pad PAD11 may serve as a first dummy gate pad in the semiconductor device 10a. The contact element C12 may serve as a gate contact window in semiconductor device 10a. The pad PAD12 may serve as a gate pad in the semiconductor device 10a. The contact element C13 may serve as a source contact window in the semiconductor device 10a. The pad PAD13 may serve as a source pad in the semiconductor device 10a.

The contact element C11 and the pad PAD11 may serve as a dummy gate terminal, the contact element C12 and the pad PAD12 may serve as a gate terminal, and the contact element C13 and the pad PAD13 may serve as a source terminal. Based on this, when operating the semiconductor device 10a, the dummy gate structure DGS may be applied with a corresponding voltage through the dummy gate terminal, the gate structure GS may be applied with a corresponding voltage through the gate terminal, and the source region SR may be applied with a corresponding voltage through the source terminal.

The second interconnection structure IS2 is, for example, located on the first surface SB_S1 of the substrate SB, and includes a dielectric layer IL2, a contact element C2 and a pad PAD2. The contact element C2 is electrically connected to the pad PAD2 and the pad PAD11. Therefore, in this embodiment, the contact element C2 may serve as a second dummy gate contact window in the semiconductor device 10a. The pad PAD2 may serve as a second dummy gate pad in the semiconductor device 10a. The dummy gate structure DGS and the second interconnection structure IS2 may be electrically connected through the dummy gate terminal in the first interconnection structure IS1. Based on this, when operating the semiconductor device 10a, the dummy gate structure DGS may be applied with a corresponding voltage through the dummy gate terminal (the contact element C11 and the pad PAD11), the contact element C2, and the pad PAD2.

In this embodiment, through the design of the second interconnection structure IS2, the phenomenon that the electric field is concentrated at the bottom of the gate structure GS may be reduced by performing the following operating mode on the semiconductor device 10a.

In detail, before the semiconductor device 10a is in a turned-on state, a negative voltage is applied to the dummy gate DG in the dummy gate structure DGS through the second interconnection structure IS2, and the electric field generated may cause electrons in the first well region WR1 and/or the second well region WR2 to gradually accumulate at the edge (the interface between the gate dielectric layer GI in the dummy gate trench TR1 and the first well region WR1 and/or the second well region WR2) of the dummy gate trench TR1. Based on this, when a positive voltage is applied to the gate G to turn on the semiconductor device 10a, the phenomenon that the electric field is concentrated at the bottom of the gate structure GS may be reduced. In addition, when the semiconductor device 10a is turned on, the dummy gate structure DGS is grounded or connected in parallel with the gate structure GS to prevent the design of the dummy gate structure DGS from affecting the electrical performance of the semiconductor device 10a.

In some embodiments, before the semiconductor device 10a is in the turned-on state, a voltage greater than or equal to −250 V and less than 0 V is applied to the dummy gate DG in the dummy gate structure DGS. For example, before the semiconductor device 10a is in the turned-on state, a voltage of −2.7 V, −10 V, −25 V, −50 V, −100 V, or −250 V may be applied to the dummy gate DG in the dummy gate structure DGS, the disclosure is not limited thereto.

In some embodiments, the dummy gate structure DGS, the gate structure GS, and the pad PAD2 in the semiconductor device 10a may have a specific shape in the normal direction n of the substrate SB. For example, referring to the partial top view schematic diagram of the semiconductor device 10a shown in FIG. 2B, the dummy gate structure DGS has a rectangular shape extending in the first direction a1, the gate structure GS has a rectangular shape extending in the first direction a1, and the pad PAD2 also has a rectangular shape extending in the first direction a1. However, the disclosure is not limited thereto.

Figure 3A:
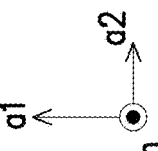
FIG. 3A is a partial top view schematic diagram of the semiconductor device according to the second embodiment of FIG. 2A.
Figure 3A:
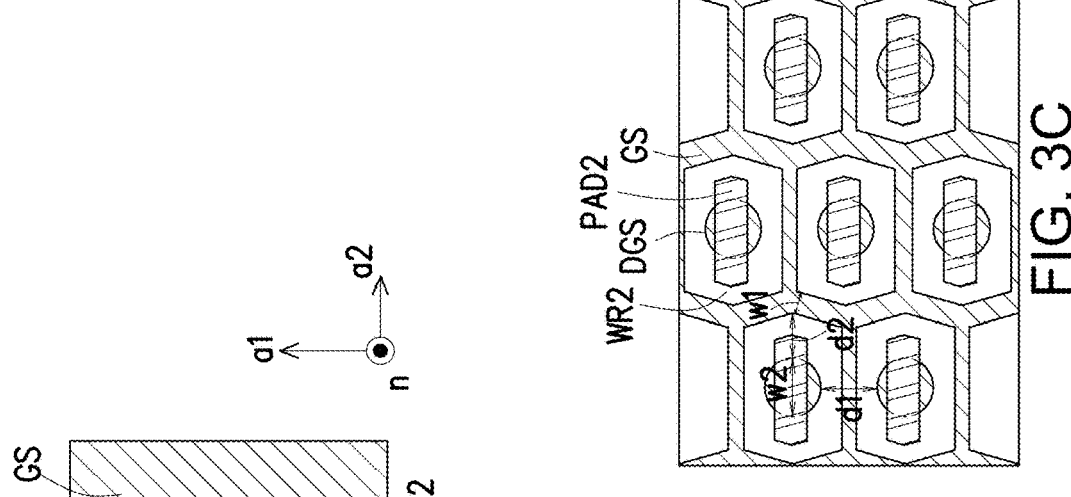
Figure 3B:
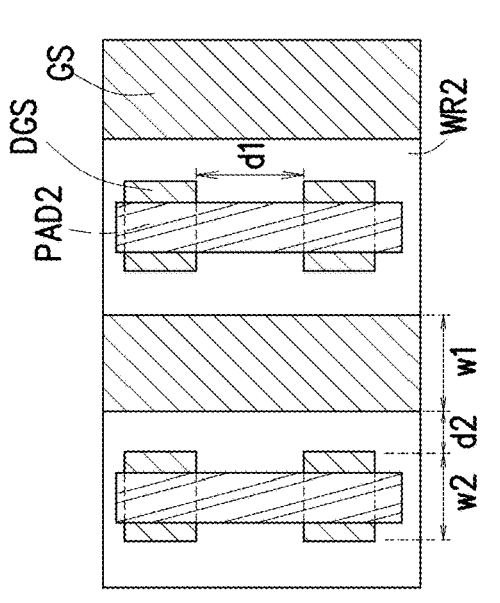
FIG. 3B is a partial top view schematic diagram of the semiconductor device according to the third embodiment of FIG. 2A.
Figure 3C:
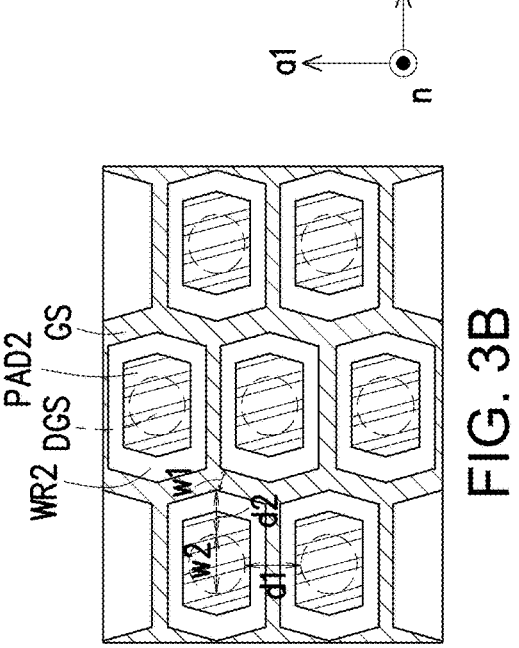
FIG. 3C is a partial top view schematic diagram of the semiconductor device according to the fourth embodiment of FIG. 2A.

In detail, FIG. 3A to FIG. 3C show the other shapes that the dummy gate structure DGS (or dummy gate trench TR1), the gate structure GS (or gate trench TR2), and the pad PAD2 in the semiconductor device 10a have in the normal direction n of the substrate SB, as introduced below.

Referring to the partial top view schematic diagram of the semiconductor device 10a shown in FIG. 3A, the dummy gate structure DGS has a rectangular shape extending in the second direction a2, the gate structure GS has a rectangular shape extending in the first direction a1, and the pad PAD2 has a rectangular shape extending in the first direction a1.

Referring to the partial top view schematic diagram of the semiconductor device 10a shown in FIG. 3B, the dummy gate structure DGS has a circular shape, the gate structure GS has a sawtooth shape extending in the first direction a1, and the pad PAD2 has a hexagonal shape.

Referring to the partial top view schematic diagram of the semiconductor device 10a shown in FIG. 3C, the dummy gate structure DGS has a circular shape, the gate structure GS has a sawtooth shape extending in the first direction a1, and the pad PAD2 has a rectangular shape extending in the second direction a2.

The dummy gate structure DGS, the gate structure GS, and the pad PAD2 (second dummy gate pad) in the semiconductor device of the disclosure are not limited to the shapes shown in the above embodiments.

EXPERIMENTAL EXAMPLES

The disclosure is described below through experimental examples and the electric field distribution diagrams shown in FIG. 4A to FIG. 4D, but these experimental examples are only for illustration and are not intended to limit the scope of the disclosure.

Embodiment 1

In Embodiment 1, the semiconductor device used has the structure of the semiconductor device 10a shown in FIG. 2A.

Embodiment 2

In Embodiment 2, it has a similar structure and composition as shown in Embodiment 1, and the only difference is that the gate structure GS is a split gate structure.

Embodiment 3

In Embodiment 3, it has a similar structure and composition as shown in Embodiment 2, and the only difference is that it further includes performing the following operations: when the semiconductor device 10a is not turned on, a voltage of −25 V is applied to the dummy gate structure DGS.

Comparative Embodiment 1

In Comparative Embodiment 1, the difference from the structure of the semiconductor device 10a shown in Embodiment 1 is that it does not have the dummy gate structure DGS (or dummy gate trench TR1), therefore it is also impossible to perform the operation of applying a negative voltage to the dummy gate structure DGS as described in Embodiment 3.

In Experimental Embodiment 1, by respectively operating the semiconductor devices of Embodiment 1, Embodiment 2, Embodiment 3, and Comparative Embodiment 1, data on the characteristic on-resistance and breakdown voltage of these semiconductor devices may be obtained, which are summarized in Table 1 below.

TABLE 1

| | Semiconductor device of Embodiment 1 | Semiconductor device of Embodiment 2 | Semiconductor device of Embodiment 3 | Semiconductor device of Comparative Embodiment 1 |
| --- | --- | --- | --- | --- |
| Characteristic on-resistance (mΩ * cm²) | 4.56 | 4.59 | 4.59 | 3.72 |
| Breakdown voltage (V) | 2301 | 2451 | 2494 | 1932 |

Referring to the data in Table 1 above, it may be seen that compared to the semiconductor device of Comparative Embodiment 1, the semiconductor devices of Embodiment 1 and Embodiment 2 include a dummy gate structure DGS. The design of the dummy gate structure DGS allows for the dispersion of the electric field, thus, the semiconductor devices of Embodiment 1 and Embodiment 2 may have a relatively high breakdown voltage.

Furthermore, the semiconductor device of Embodiment 3 further applies a negative voltage to the dummy gate structure DGS before being turned on to further reduce the phenomenon that the electric field is concentrated at the bottom of the gate structure GS. Therefore, the semiconductor device of Embodiment 3 may have a higher breakdown voltage.

Those skilled in the art may design appropriate characteristic on-resistance and breakdown voltage according to requirements. In detail, taking the semiconductor device of Embodiment 3 as an example, the resistivity in the first well region WR1 may be reduced by appropriately increasing the doping concentration of the first well region WR1 (drift region), thereby reducing the characteristic on-resistance of the semiconductor device.

Figure 4A:
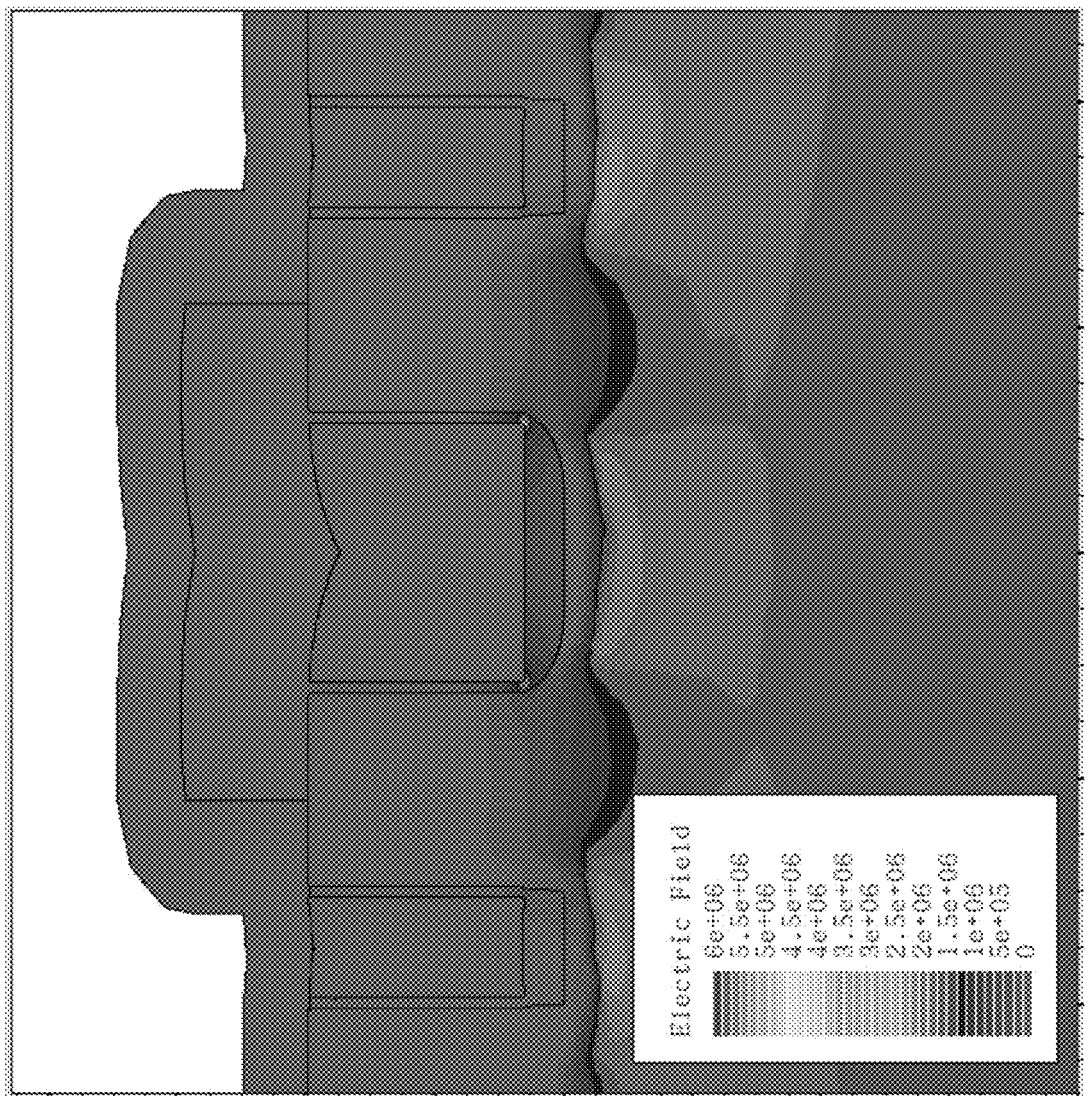
FIG. 4A shows a schematic diagram of the electric field distribution in the semiconductor device of Embodiment 1 of the disclosure.
Figure 4B:
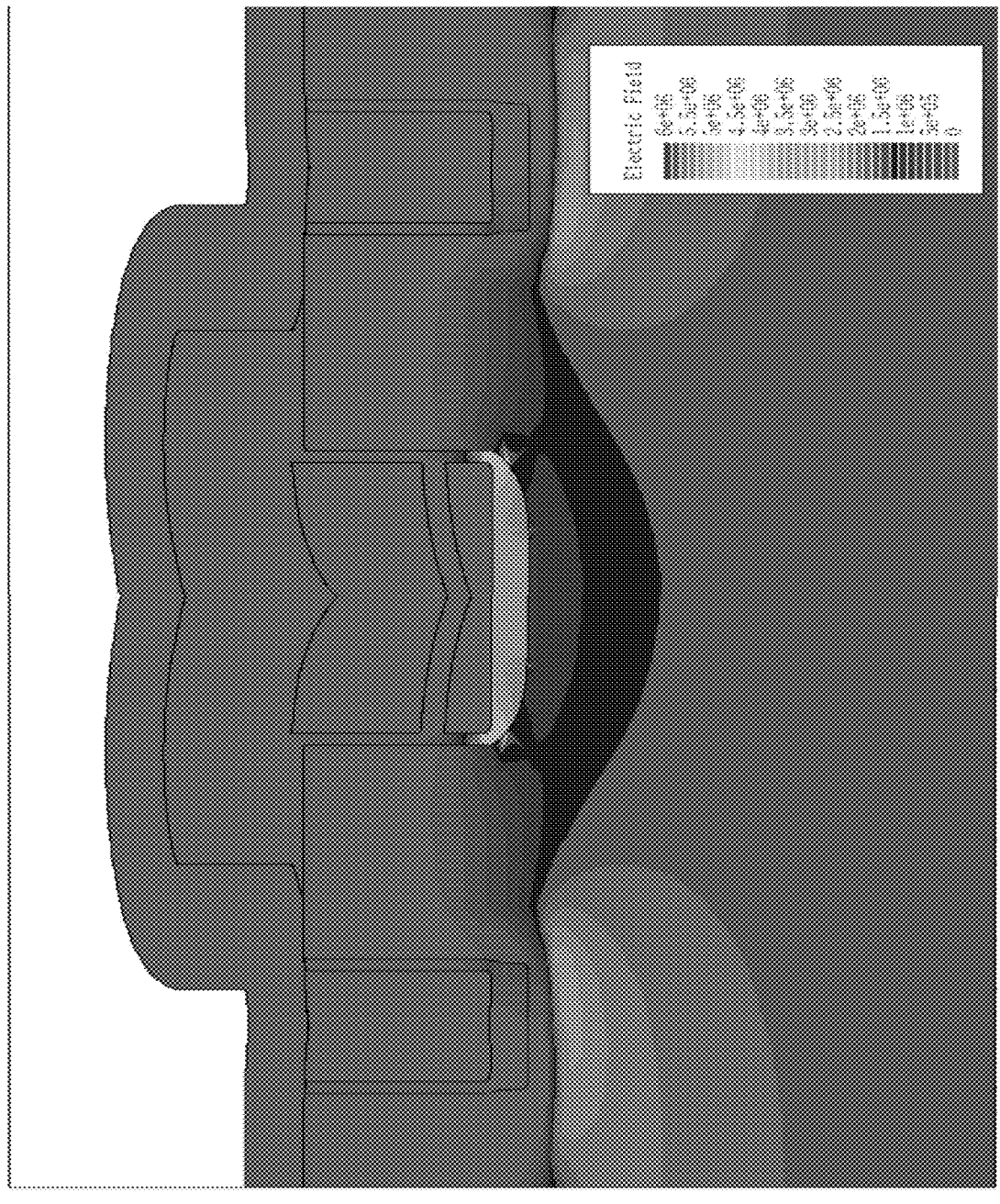
FIG. 4B shows a schematic diagram of the electric field distribution in the semiconductor device of Embodiment 2 of the disclosure.
Figure 4C:
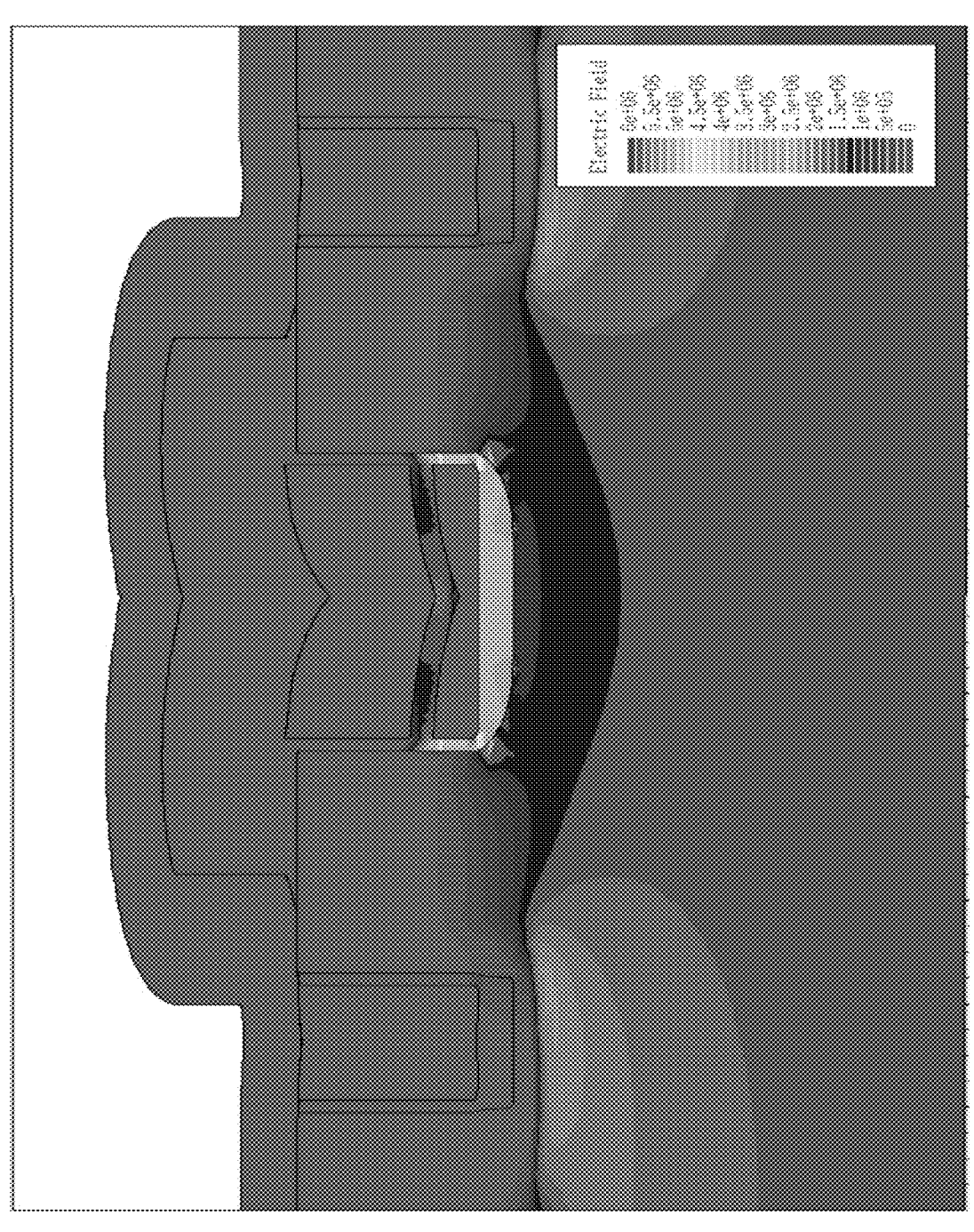
FIG. 4C shows a schematic diagram of the electric field distribution in the semiconductor device of Embodiment 3 of the disclosure.
Figure 4D:
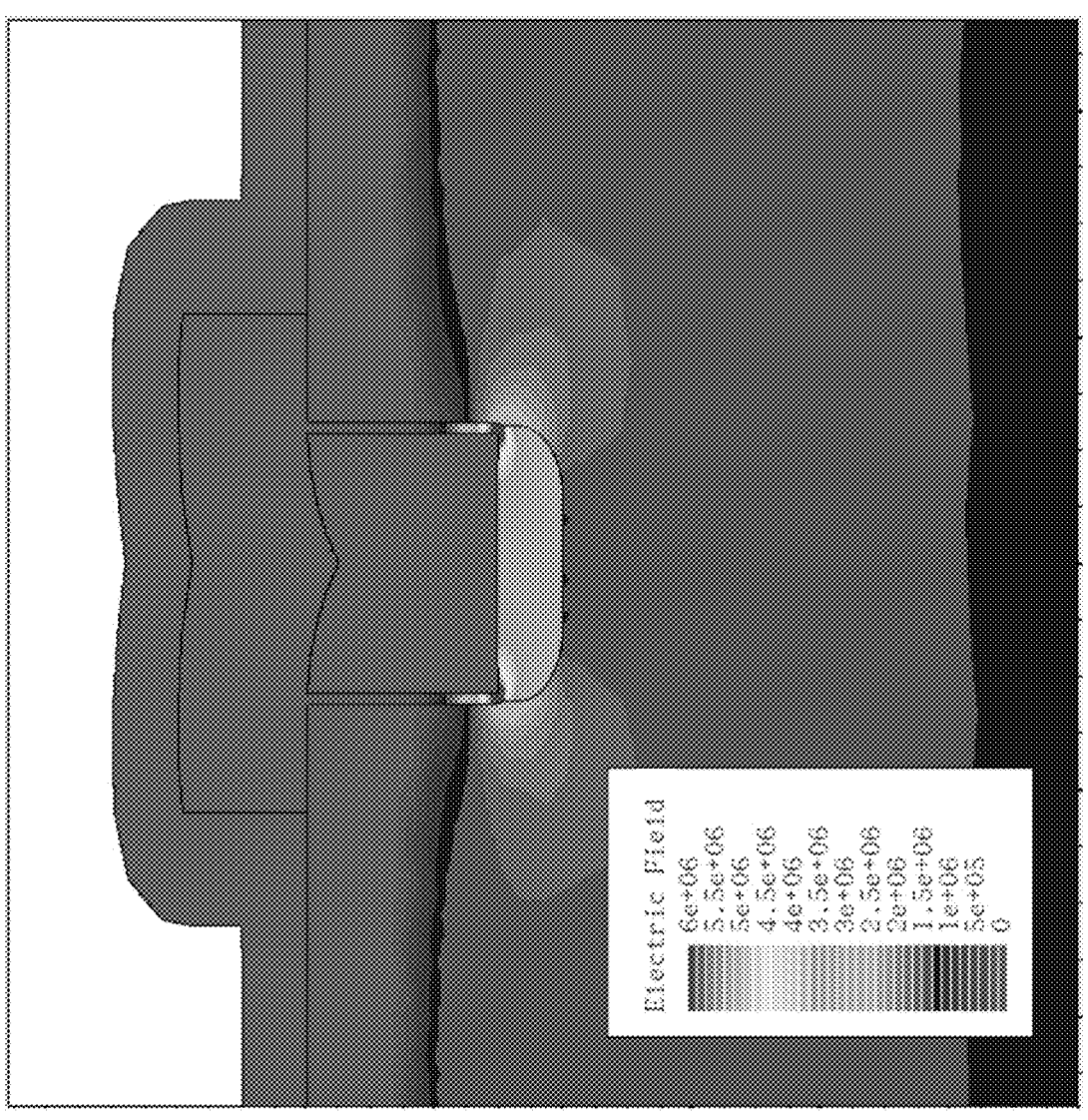
FIG. 4D shows a schematic diagram of the electric field distribution in the semiconductor device of Embodiment 4 of the disclosure.

FIG. 4A shows a schematic diagram of the electric field distribution in the semiconductor device of Embodiment 1 of the disclosure, FIG. 4B shows a schematic diagram of the electric field distribution in the semiconductor device of Embodiment 2 of the disclosure, FIG. 4C shows a schematic diagram of the electric field distribution in the semiconductor device of Embodiment 3 of the disclosure, and FIG. 4D shows a schematic diagram of the electric field distribution in the semiconductor device of Embodiment 4 of the disclosure.

Referring to FIG. 4A to FIG. 4D at the same time, it may be seen that the electric field at the bottom of the gate structure in the semiconductor device of Embodiment 1 to Embodiment 3 are smaller than the electric field at the bottom of the gate structure in the semiconductor device of Comparative Embodiment 1. The reason is that the semiconductor devices of Embodiment 1 to Embodiment 3 include a dummy gate structure, so that the semiconductor devices of Embodiment 1 to Embodiment 3 may have a relatively high breakdown voltage. Furthermore, by applying a negative voltage to the dummy gate structure before the semiconductor device in Embodiment 3 is turned on, the electrons in the first well region and/or the second well region are gradually accumulated at the edge of the dummy gate structure. Therefore, the semiconductor device of Embodiment 3 may further achieve the effect of uniform electric field, thereby allowing the semiconductor device of Embodiment 3 to have a higher breakdown voltage.

Figure 5:
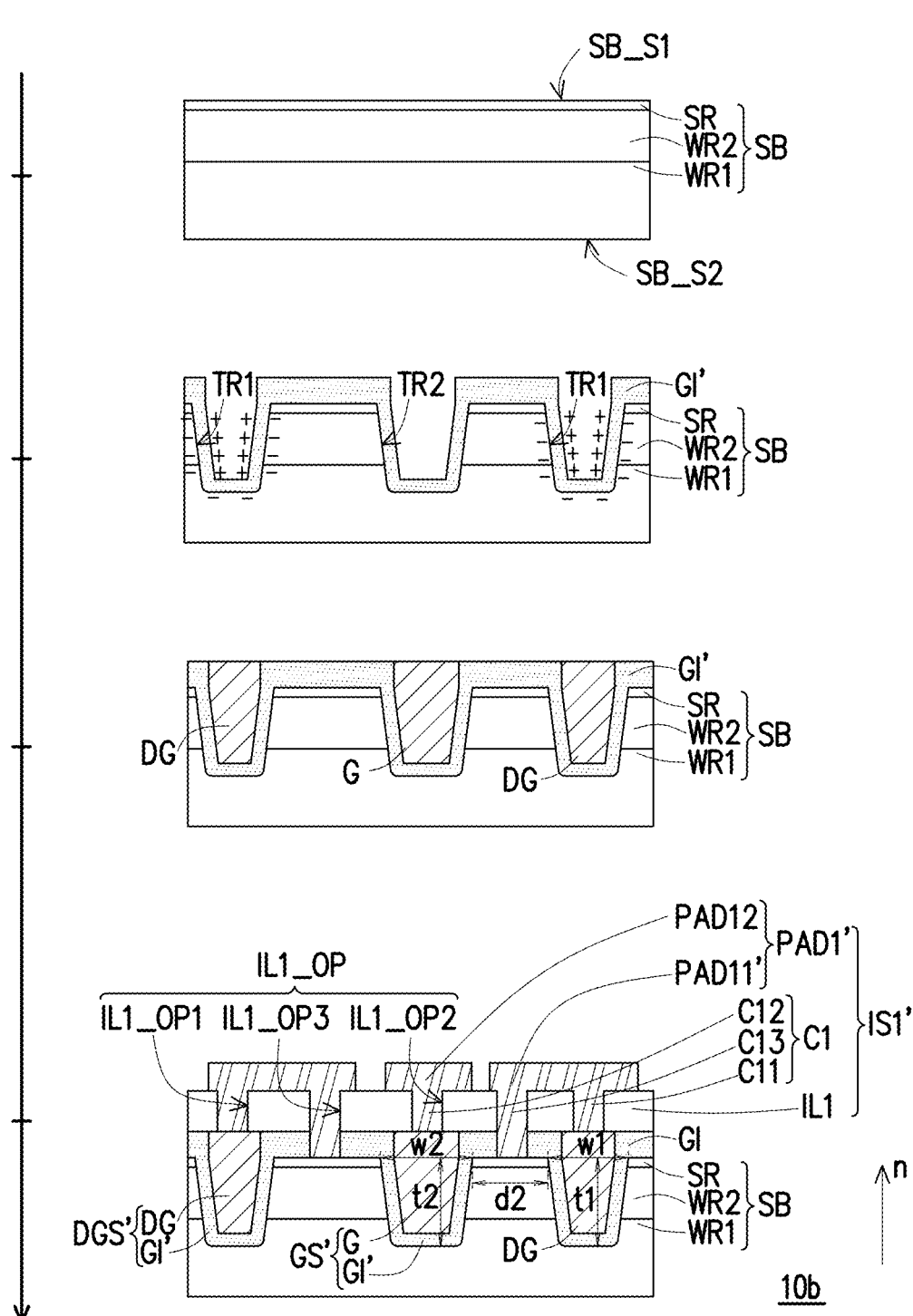
FIG. 5 is a process schematic diagram of a manufacturing method of a semiconductor device according to another embodiment of the disclosure.

FIG. 5 is a process schematic diagram of a manufacturing method of a semiconductor device according to another embodiment of the disclosure. The embodiment of FIG. 5 may use the reference numerals and a part of the contents of the embodiment of FIG. 1, and the same or similar reference numerals are used to denote the same or similar elements, and the description of the same technical content is omitted.

FIG. 5 shows the manufacturing method of the semiconductor device 10b of this embodiment. Referring to FIG. 5, a substrate SB is provided, in which the substrate SB has a first well region WR1, a second well region WR2, and a source region SR. For the material of the substrate SB and its forming method, reference may be made to the above embodiments, and are not repeated herein.

Continue to refer to FIG. 5, a patterning process is performed on the substrate SB to form multiple trenches TR in the substrate SB, and a gate dielectric layer GI' is formed on the first surface SB_S1 of the substrate SB.

For the forming method of the trenches TR, reference may be made to the above embodiment, and is not repeated herein.

The gate dielectric layer GI' may be formed, for example, by using chemical vapor deposition or other suitable processes, but the disclosure is not limited thereto. In this embodiment, the material of the gate dielectric layer GI' includes a specific dielectric material with a high dielectric constant. After the gate dielectric layer GI' is formed on the first surface SB_S1 of the substrate SB, the gate dielectric layer GI' contacts the first well region WR1 and the second well region WR2. However, the above-mentioned gate dielectric layer GI' is a heterojunction with the first well region WR1 and the second well region WR2, and a band offset occurs when they come into contact. In order to band align the energy bands of the gate dielectric layer GI' with the first well region WR1 and/or the second well region WR2, electron transfer occurs between the gate dielectric layer GI' and the first well region WR1 and the second well region WR2.

When the energy difference between the charge neutrality level (CNL) and the vacuum level of the material of the gate dielectric layer GI' is less than the energy difference between the charge neutrality level and the vacuum level of the material of the first well region WR1 (semiconductor layer material), electrons transfer from the gate dielectric layer GI' to the first well region WR1. Therefore, the first well region WR1 located at the edge of the dummy gate trench TR1 gradually accumulates electrons, so that an interface dipole is formed between the subsequently formed dummy gate structure DGS' and the first well region WR1.

Based on the above, in this embodiment, considering that electrons may be transferred from the gate dielectric layer GI' to the first well region WR1, the material of the gate dielectric layer GI' includes lanthanum aluminate (LaAlO$_3$), zirconium dioxide (ZrO$_2$), hafnium dioxide (HfO$_2$), gallium oxide (Ga$_2$O$_3$), aluminum oxide (Al$_2$O$_3$), titanium dioxide (TiO$_2$), tantalum pentoxide (Ta$_2$O$_5$) or other suitable dielectric materials with high dielectric constant, the disclosure is not limited thereto.

Continue referring to FIG. 5, a gate G and a dummy gate DG are formed in each of the trenches TR of the substrate SB. For the forming method of the gate G and the dummy gate DG, reference may be made to the above embodiment, and are not repeated herein.

Continue referring to FIG. 5, a first interconnection structure IS1' is formed on the first surface SB_S1 of the substrate SB, in which the first interconnection structure IS1' includes a dielectric layer IL1, a contact element C1, and a pad PAD1'. In some embodiments, forming the first interconnection structure IS1 may include performing the following steps, but the disclosure is not limited thereto.

First, a dielectric material layer (not shown) is formed on the first surface SB_S1 of the substrate SB using a chemical vapor deposition method or other suitable processes, in which the dielectric material layer covers the gate electrode G, the dummy gate electrode DG, and the gate dielectric layer GI'. Next, a patterning process is performed on the dielectric material layer to form a dielectric layer IL1 including an opening IL1_OP. The opening IL1_OP of the dielectric layer IL1 includes the opening IL1_OP1 exposing the dummy gate DG, the opening IL1_OP2 exposing the gate G, and the opening IL1_OP3 exposing the source region SR. Afterwards, the contact element C1 is formed in the opening IL1_OP of the dielectric layer IL1 by using a suitable process, and the pad PAD1 electrically connected to the contact element C1 is formed on the dielectric layer IL1 by using a suitable process. In this embodiment, the contact element C1 includes a contact element C11 electrically connected to the dummy gate DG, a contact element C12 electrically connected to the gate G, and a contact element C13 electrically connected to the source region SR. In addition, in this embodiment, the pad PAD1' includes a pad PAD11' electrically connected to the contact element C11 and the contact element C13, and a pad PAD12 electrically connected to the contact element C12.

The semiconductor device 10b of this embodiment is introduced below using FIG. 6, and the overlapping technical contents are not repeated herein. The partial top view schematic diagrams of the semiconductor device shown in FIG. 2B and FIG. 3A to FIG. 3C may also be applied to the semiconductor device 10b.

Figure 6:
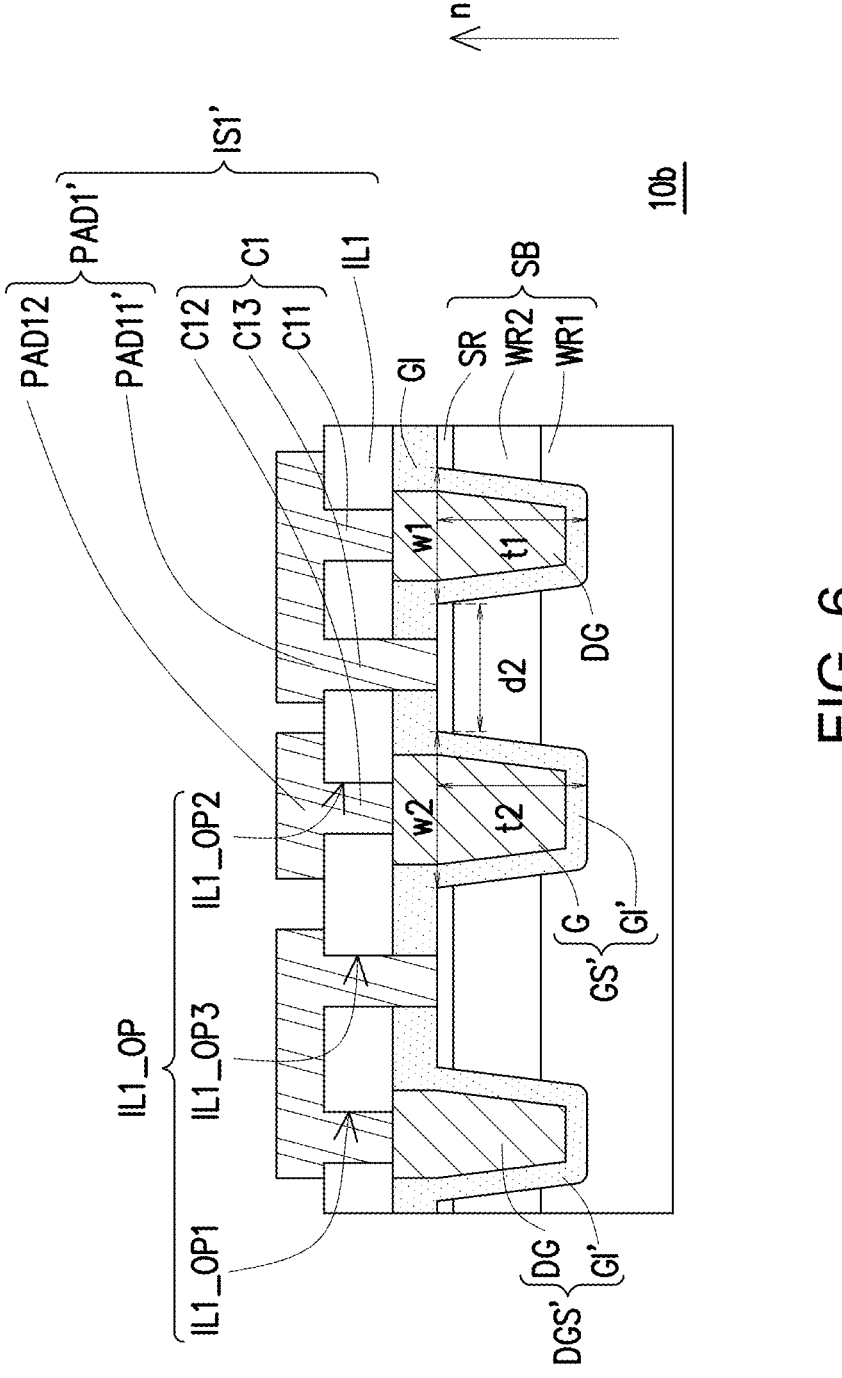
FIG. 6 is a partial cross-sectional schematic diagram of a semiconductor device of an embodiment manufactured according to the process of FIG. 5.

FIG. 6 is a partial cross-sectional schematic diagram of a semiconductor device of an embodiment manufactured according to the process of FIG. 5.

In this embodiment, the semiconductor device 10b includes a substrate SB, a dummy gate structure DGS', a gate structure GS', and a first interconnection structure IS1'.

For the material of the substrate SB and the doped region it includes, reference may be made to the above embodiments, and are not repeated herein.

The dummy gate structure DGS' is located, for example, in the substrate SB. In this embodiment, the dummy gate structure DGS' may include a dummy gate DG and a gate dielectric layer GI' located in the dummy gate trench TR1 of the substrate SB. The dummy gate structure DGS' may extend from the source region SR to the first well region WR1, that is, a portion of the dummy gate structure DGS' may be located in the first well region WR1. For the depth t1 and width w1 of the dummy gate trench TR1 and the distance d1 between adjacent dummy gate trenches TR1, reference may be made to the above embodiment, and are not repeated herein.

The gate structure GS' is, for example, located in the substrate SB, and is, for example, located between adjacent dummy gate structures DGS'. In this embodiment, the gate structure GS' may include a gate G and a gate dielectric layer GI' located in the gate trench TR2 of the substrate SB. In some embodiments, for the depth t2 and width w2 of the gate trench TR2 and the distance d2 between the adjacent gate trench TR2 and the dummy gate trench TR1, reference may be made to the above embodiment, and are not repeated herein.

The first interconnection structure IS1' is, for example, located on the first surface SB_S1 of the substrate SB. In this embodiment, the first interconnection structure IS1 includes a dielectric layer IL1, a contact element C1, and a pad PAD1'. The contact element C1 includes a contact element C11, a contact element C12, and a contact element C13. The pad PAD1 includes a pad PAD11' and a pad PAD12. The dummy gate DG in the dummy gate structure DGS' is electrically connected to the contact element C11 and the pad PAD11'. The gate G in the gate structure GS' is electrically connected to the contact element C12 and the pad PAD12. The source region SR is electrically connected to the contact element C13 and the pad PAD11'. In this embodiment, the contact element C11 may serve as a dummy gate contact window in the semiconductor device 10b. The pad PAD11' may serve as a dummy gate pad and/or source pad in the semiconductor device 10b. The contact element C12 may serve as a gate contact window in the semiconductor device 10b. The pad PAD12 may serve as a gate pad in the semiconductor device 10b. The contact element C13 may serve as a source contact window in the semiconductor device 10b.

In this embodiment, through the design of the gate dielectric layer GI', electron transfer occurs between the dummy gate structure DGS' and the first well region WR1, so that the electrons in the first well region WR1 and the second well region WR2 may accumulate at the edge (the interface between the gate dielectric layer GI' in the dummy gate trench TR1 and the first well region WR1 and the second well region WR2) of the gate trench TR2. Based on this, when a positive voltage is applied to the gate G of the semiconductor device 10b to turn on the semiconductor device 10b, the phenomenon that the electric field is concentrated at the bottom of the gate structure GS' may be reduced. In addition, in this embodiment, the dummy gate DG is electrically connected to the source region SR to prevent the design of the dummy gate structure DGS' from affecting the electrical performance of the semiconductor device 10b.

To sum up, some embodiments of the disclosure provide a semiconductor device that includes a trench-type dummy gate structure and a second interconnection structure electrically connected thereto. Before the semiconductor device is in a turned-on state, a negative voltage is applied to the dummy gate structure through the second interconnection structure, and the electric field generated may cause electrons in the first well region and/or the second well region to gradually accumulate at the edge of the dummy gate structure. Based on this, when the semiconductor device is turned on, the phenomenon that the electric field is concentrated at the bottom of the gate structure may be reduced, so that the semiconductor device may have a relatively high breakdown voltage and improve its reliability.

Furthermore, other embodiments of the disclosure also provide a semiconductor device including a trench-type dummy gate structure, in which the dummy gate structure includes a gate dielectric layer of a specific dielectric material with a high dielectric constant. By selecting the gate dielectric layer of the above-mentioned specific material, an interface dipole may be formed between the gate dielectric layer and the first well region and the second well region, that is, electrons are transferred from the gate dielectric layer to the first well region. Therefore, electrons in the first well region and/or the second well region may gradually accumulate at the edge of the dummy gate structure. Based on this, when the semiconductor device is turned on, the phenomenon that the electric field is concentrated at the bottom of the gate structure may be reduced, so that the semiconductor device may have a relatively high breakdown voltage and improve its reliability.

What is claimed is:

1. A semiconductor device, comprising:
a substrate, having a dummy gate trench and a gate trench, and comprising:
  a first well region, formed by doping at least one element from a first element group, and having a first conductive channel;
  a second well region, formed by doping at least one element from a second element group, wherein a number of valence electrons in the second element group and a number of valence electrons in the first element group are different, the second well region is located on the first well region and has a second conductive channel, and a polarity of the second conductive channel is opposite to a polarity of the first conductive channel; and
  a source region, formed by doping at least one element and a dopant from the first element group, wherein an atomic concentration of the source region is higher than an atomic concentration of the first well region, and the source region is located in the second well region and has the first conductive channel;
a dummy gate structure, located in the dummy gate trench of the substrate, wherein a portion of the dummy gate structure is located in the first well region;
a gate structure, located in the gate trench of the substrate, and located between adjacent dummy gate structures;
a first interconnection structure, located on the substrate and comprising a dummy gate terminal; and
a second interconnection structure, located on the first interconnection structure, wherein the dummy gate structure and the second interconnection structure are electrically connected through the dummy gate terminal.

2. The semiconductor device according to claim 1, wherein before the semiconductor device is turned on, a negative voltage is applied to a dummy gate in the dummy gate structure through the second interconnection structure.

3. The semiconductor device according to claim 2, wherein a voltage greater than or equal to −250 V and less than 0 V is applied to the dummy gate in the dummy gate structure.

4. The semiconductor device according to claim 1, wherein a distance between two adjacent dummy gate trenches is less than or equal to 4 microns.

5. The semiconductor device according to claim 1, wherein the dummy gate trench has a depth greater than or equal to 1 micron and less than or equal to 4 microns.

6. The semiconductor device according to claim 1, wherein the gate trench has a depth greater than or equal to 0.25 microns and less than or equal to 5 microns.

7. The semiconductor device according to claim 1, wherein a distance between the adjacent gate trench TR2 and the dummy gate trench TR1 is less than 8 microns.

8. A semiconductor device, comprising:
a substrate, having a dummy gate trench and a gate trench, and comprising:
  a first well region, formed by doping at least one element from a first element group, and having a first conductive channel;
  a second well region, formed by doping at least one element from a second element group, wherein a number of valence electrons in the second element group and a number of valence electrons in the first element group are different, the second well region is located on the first well region and has a second conductive channel, and a polarity of the second conductive channel is opposite to a polarity of the first conductive channel; and
  a source region, formed by doping at least one element and a dopant from the first element group, wherein an atomic concentration of the source region is higher than an atomic concentration of the first well region, and the source region is located in the second well region and has the first conductive channel;
a dummy gate structure, located in the dummy gate trench of the substrate, wherein a portion of the dummy gate structure is located in the first well region; and
a gate structure, located in the gate trench of the substrate, and located between adjacent dummy gate structures,
wherein an interface dipole is formed between the dummy gate structure and the first well region.

9. The semiconductor device according to claim 8, wherein a gate dielectric layer in the dummy gate structure comprises a dielectric material with high dielectric constant.

10. The semiconductor device according to claim 9, wherein a material of the gate dielectric layer comprises lanthanum aluminate ($LaAlO_3$), zirconium dioxide ($ZrO_2$), hafnium dioxide ($HfO_2$), gallium oxide ($Ga_2O_3$), aluminum oxide ($Al_2O_3$), titanium dioxide ($TiO_2$), and tantalum pentoxide ($Ta_2O_5$).

* * * * *